United States Patent
Joy et al.

(10) Patent No.: US 7,551,114 B2
(45) Date of Patent: Jun. 23, 2009

(54) REDUCING POWER CONSUMPTION IN THE EARLY STAGES OF A PIPELINE SUB-ADC USED IN A TIME-INTERLEAVED ADC

(75) Inventors: Jomy Joy, Bangalore (IN); Ankit Seedher, Bangalore (IN); Ayaskant Shrivastava, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 66 days.

(21) Appl. No.: 11/748,495

(22) Filed: May 15, 2007

(65) Prior Publication Data

US 2008/0284625 A1     Nov. 20, 2008

(51) Int. Cl.
*H03M 1/38* (2006.01)
(52) U.S. Cl. ........................ 341/161; 341/122
(58) Field of Classification Search ............ 341/155, 341/161, 122, 163
See application file for complete search history.

(56) References Cited

U.S. PATENT DOCUMENTS

| | | |
|---|---|---|
| 4,968,988 A | 11/1990 | Miki et al. |
| 6,323,800 B1 * | 11/2001 | Chiang ................ 341/161 |
| 7,053,804 B1 | 5/2006 | Nairn |
| 7,075,471 B1 | 7/2006 | Gupta |
| 7,170,436 B2 | 1/2007 | Ye |

* cited by examiner

*Primary Examiner*—Peguy JeanPierre
(74) *Attorney, Agent, or Firm*—Steven A. Shaw; W. James Brady; Frederick J. Telecky, Jr.

(57) ABSTRACT

A stage of a pipelined ADC used as a sub-ADC in a time-interleaved ADC is operated using a first set of clock signals, with a next stage being operated using a second set of clock signals. The first set and second set of clock signals are designed to cause the start of hold phases of the stage to occur earlier than the sample phases of the next stage. In an embodiment, the start of the hold phases is coincident with the end of an immediately preceding sample phase of the stage. As a result, more time is provided for the output of an amplifier used in the stage to settle to a final value, thus permitting use of a low speed amplifier and reduction in power consumption in the interleaved ADC. In an embodiment, the stage corresponds to an earliest stage in the pipelined sub-ADC.

16 Claims, 5 Drawing Sheets

REDUCING POWER CONSUMPTION IN THE EARLY STAGES OF A PIPELINE SUB-ADC USED IN A TIME-INTERLEAVED ADC

BACKGROUND

1. Field of the Invention

The present invention relates generally to the design of analog to digital converters (ADC), and more specifically to a technique for reducing power consumption in the early stages of a pipelined sub-ADC in a time-interleaved ADC.

2. Related Art

An analog to digital converter (ADC) is generally used to sample an analog signal at various time instances, and generate a digital code representing the strength (of voltage or current) of the sampled analog signal at the corresponding time instance.

Time interleaved ADC is a type of ADC in which multiple individual ADCs (conveniently hereafter referred to as sub-ADCs) are operated in parallel, with each sub-ADC sampling a corresponding successive sample of the analog input signal in a time-interleaved fashion. The samples generated by the sub-ADCs are then multiplexed into a single stream to represent the output codes generated by the interleaved ADC. Due to such an operation, each sub-ADC may be designed for lower sampling rates, while the time interleaved ADC provides high overall sampling rates.

Pipelined ADCs are often used to implement sub-ADCs in a time-interleaved ADC. A pipelined ADC is a type of ADC which contains a sequence of (pipelined) stages, with each stage resolving a number of bits forming a sub-code. The sub-codes generated by various stages are used to generate a digital code corresponding to the analog input sampled by the corresponding sub-ADC.

Each stage (except the last stage) of a pipelined ADC generates a residue signal representing that portion of the input signal that needs to be resolved by subsequent stages. The residue signal represents a difference of the voltage of the input signal to the stage and the voltage level corresponding to the sub-code provided by the stage. The residue signal (in an amplified form, typically) of one stage is provided as an input signal to the next stage in the sequence. In general the first stage represents an early stage (since the sample is processed first by the first stage) in the sequence.

There is a general need to reduce power consumption in ADCs, and in particular the early stages of pipelined sub-ADC. Such reduction is of concern in early stages since early stages are generally implemented using components consuming a large amount of power, for enhanced accuracy and/or performance, as is well known in the relevant arts.

BRIEF DESCRIPTION OF THE DRAWINGS

The present invention will be described with reference to the following accompanying drawings, which are described briefly below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

According to an aspect of the present invention, a stage of a pipelined ADC used as a sub-ADC in a time-interleaved ADC is operated using a first set of clock signals, with a next stage being operated using a second set of clock signals. The first set of clock signals and the second set of clock signals are designed to cause hold phases of the stage to commence earlier than sampling phases of the next stage.

As a result, more time is provided for the output of an amplifier used in the stage to settle to a final value, thus permitting the use of a low speed amplifier and reduction in power consumption in the interleaved ADC. In an embodiment, the stage corresponds to an earliest stage in the pipelined sub-ADC.

As the features of the invention pertain to time interleaved ADCs, the description is continued with respect to an example embodiment of a time interleaved ADC.

2. Time-Interleaved ADC

Figure 1:
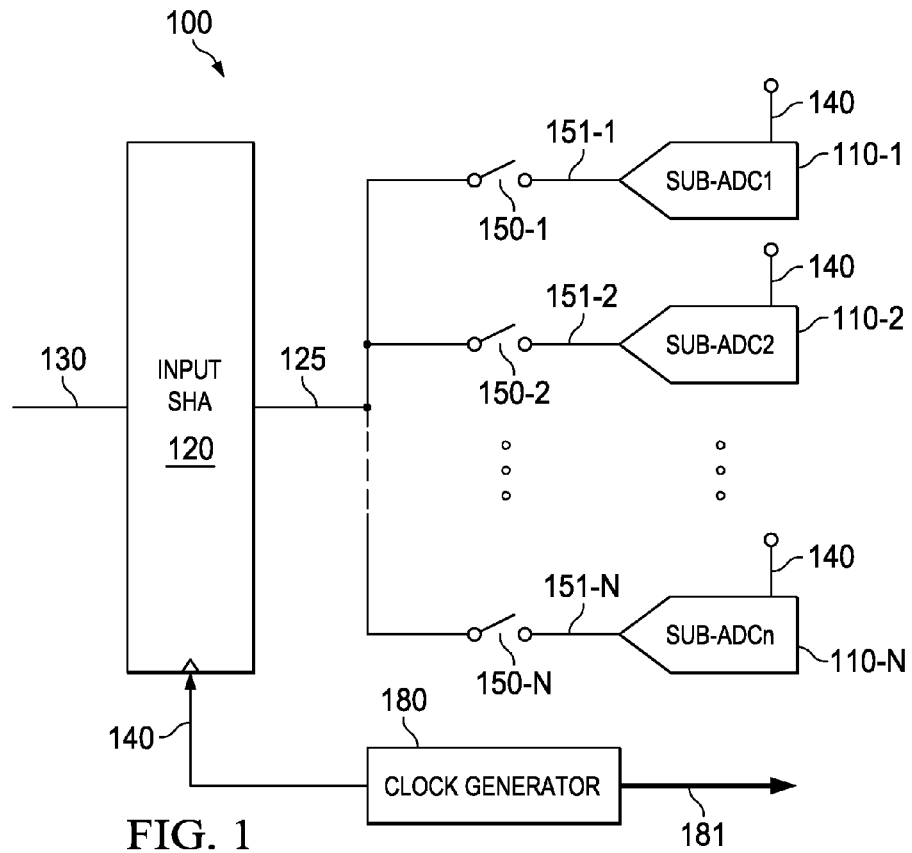
FIG. 1 is a block diagram of a time-interleaved ADC in an embodiment.

FIG. 1 is a block diagram of a time interleaved ADC in an embodiment. Time interleaved ADC 100 is shown containing input sample and hold amplifier (input SHA) 120, sub-ADCs 110-1 through 110-N, switches 150-1 through 150-N, and clock generator 180. Each component is described below.

Clock generator 180 generates various clock signals used for determining (controlling) sample and hold phases (operations) of the components/units in time interleaved ADC 100. Clock generator 180 generates clock 140 to input SHA 120, and multiple clocks on path 181 to control sample and hold operations for internal stages/units in sub-ADCs 110-1 through 110-N as well as for controlling opening/closing of switches 150-1 through 150-N (though connections are not shown in the Figure).

Input SHA 120 receives an analog input on path 130, and in response to clock 140 (for example, an edge of clock 140) samples the analog input (captures samples of the analog signal). Input SHA 120 provides the captured samples on path 125. Input SHA 120 represents an example of a sample and hold unit. Other techniques, potentially without amplification, may be used in place of input SHA 120.

Each of switches 150-1 through 150-N operates to provide a corresponding sample (sample at a corresponding time interval) of the analog input on respective paths 151-1 through 151-N. In general, each switch (and only that switch) closes at a corresponding time instance, and for a corresponding duration of time, to provide samples of the analog input in a time interleaved manner, illustrated with example timing diagram in sections below. Switches 150-1 through 150-N may be controlled by clock signals generated by clock generator 180 and contained in path 181.

Each of sub-ADCs 110-1 through 110-N receives a corresponding sample of the analog input (130) in a corresponding time interval, and operates to provide a digital code corresponding to the strength (voltage/current) of the sample. The samples generated by the sub-ADCs may then be multiplexed into a single stream (not shown) to represent the digital codes generated by time interleaved ADC 100. Various clocks used to specify sample/hold intervals or operations for internal stages/units in each of the sub-ADCs are provided on path 181 by clock generator 180.

Each of sub-ADCs 110-1 through 110-N may be implemented as a pipelined ADC, the internal details of which are described next.

3. Pipelined Sub-ADC

Figure 2:
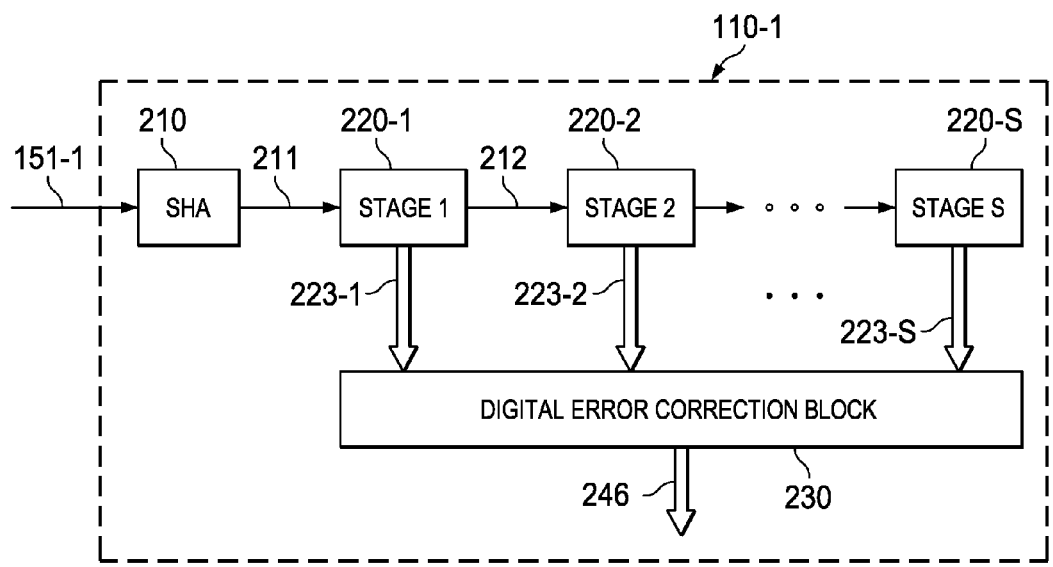
FIG. 2 is a block diagram illustrating the details of a pipelined sub-ADC used in a time-interleaved ADC in an embodiment.

FIG. 2 is a block diagram illustrating the details of sub-ADC 110-1 implemented as a pipelined ADC in an embodiment. Sub-ADC 110-1 is shown containing sample and hold amplifier (SHA) 210, and stages 220-1 through 220-S and digital error correction block 230. Each block is described below in further detail.

SHA 210 samples the input signal received on path 151-1, and holds the voltage level of the sample for further processing. Each stage 220-1 through 220-S generates a sub-code corresponding to a voltage level of an analog signal received as an input, and an amplified residue signal as an input to a (any) next stage. For example, stage 220-1 converts a voltage level on path 211 to generate a sub-code on path 223-1, and the amplified residue signal generated on path 212 is provided as an input to stage 220-2.

Digital error correction block 230 receives sub-codes from various stages, and generates a digital code corresponding to the sample received on path 151-1. Essentially, it performs a weighted addition of the sub-codes to generate the overall code, as is well known in the relevant arts. The generated digital code is provided on path 246.

Figure 3:
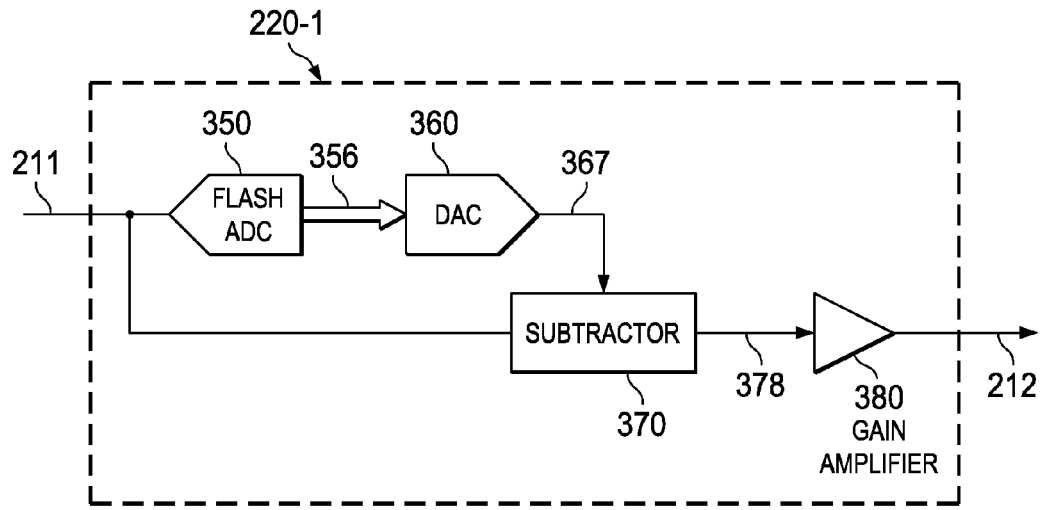
FIG. 3 is a block diagram illustrating the internal details of a stage of a pipelined sub-ADC in an embodiment.

FIG. 3 further illustrates the components contained in each stage (described with reference to stage 220-1 only, for conciseness) in an embodiment. Stage 220-1 is shown containing flash ADC 350, digital to analog converter (DAC) 360, subtractor 370 and gain amplifier 380. Flash ADC 350 converts a sample of an analog signal received on path 211 into a corresponding P-bit sub-code provided on path 356 (contained in path 223-1 of FIG. 2, and P is less than N, wherein N is the number of bits of the overall digital output code provided on path 246 by sub-ADC 110-1). DAC 360 converts the sub-code received on path 356 into corresponding analog signal (Vdac) on path 367.

Subtractor 370 generates a residue signal as the difference of sample 211 (Vin) and the analog signal received on path 367 (Vdac). Gain amplifier 380 amplifies the residue signal (Vin-Vdac) and is provided on path 212 as an amplified residue signal. The signal on path 212 is used to resolve the remaining bits in the N-bit digital code by the subsequent stages.

Subtractor 370, DAC 360, and gain amplifier 380 may be implemented using a capacitor network and an operational amplifier according to one of several techniques such as charge redistribution stage, flip-around charge redistribution stage etc. An embodiment implemented as a charge redistribution stage is described next.

4. Switched-Capacitor Network and Amplifier Used in a Stage

Figure 4:
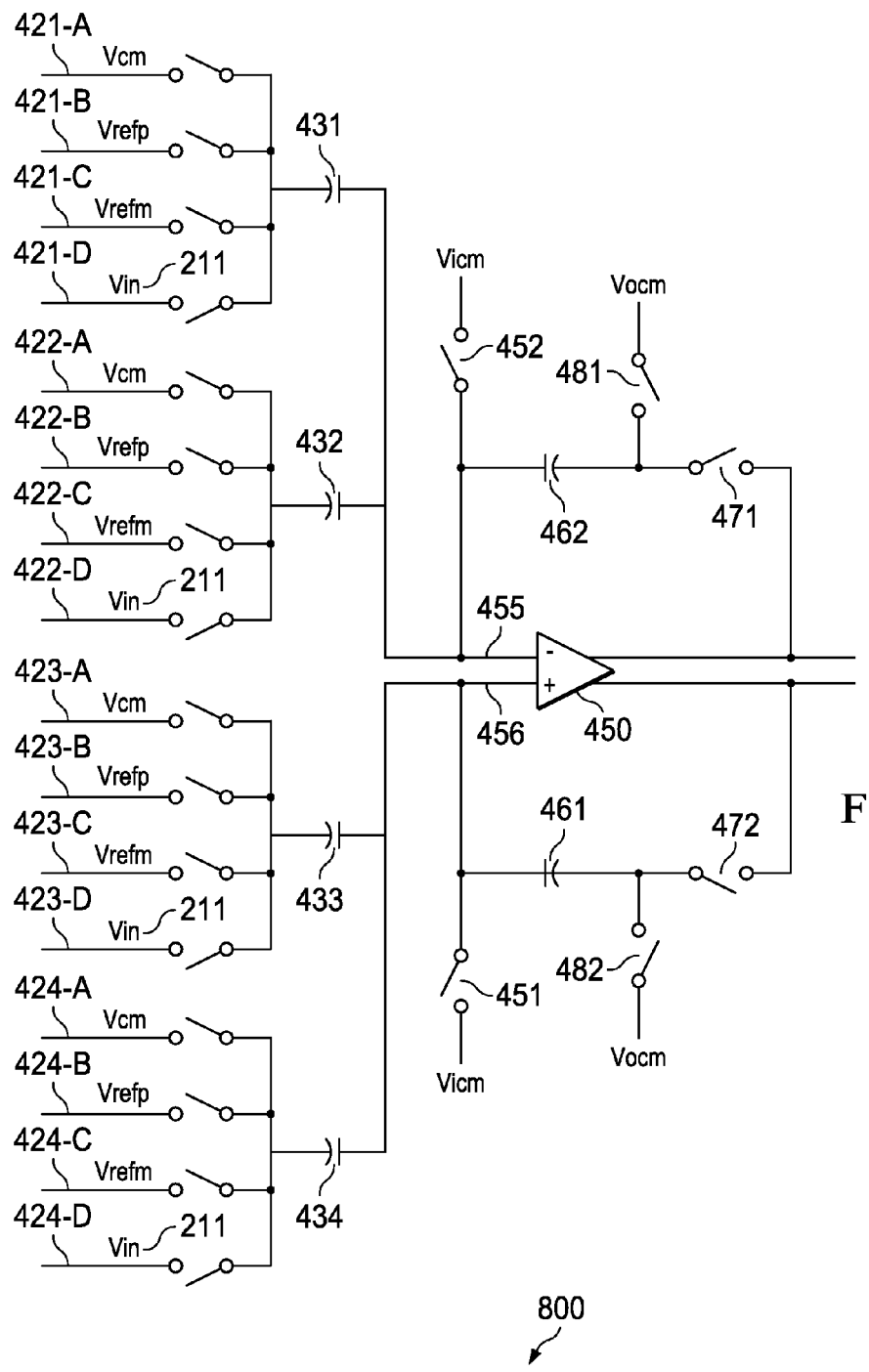
FIG. 4 is a circuit diagram of a portion of a pipelined sub-ADC implemented according to a charge redistribution technique in an embodiment.

FIG. 4 is a circuit diagram illustrating the manner in which subtractor 370, DAC 360, and gain amplifier 380 of stage 220-1 are implemented in an embodiment that uses a 'general' charge redistribution technique. It must be noted that subtractor 370, DAC 360, and gain amplifier 380 can also be implemented according to other techniques such as a flip-around charge redistribution technique.

Subtractor 370, DAC 360, and gain amplifier 380 are shown implemented using operational amplifier 450, sampling capacitors 431-434, feedback capacitors 461 and 462, sampling switches 421D, 422D, 423D and 424D, DAC switches 421 A-C, 422A-C, 423A-C and 424A-C, common mode switches 451 and 452, reset switches 481 and 482, and feedback switches 471 and 472. The operation of each component is described below in further detail.

Sampling switches 421D, 422D, 423D and 424D, reset switches 481 and 482, and common mode switches 451 and 452 make contact (closed) during sample phase (interval). The remaining switches are in break state (open) during the sample phase. As a result, all the sampling capacitors 431-434 are connected to input signal Vin (i.e., signal on path 211 of FIGS. 2 and 3), and amplifier inputs 455 and 456 are connected to common mode input Vicm. One end of capacitors 461 and 462 is connected to common mode input Vicm while the other end is connected to another common mode input Vocm. Typically, Vicm and Vocm are set to ensure proper operation of the operational amplifier 450. Thus, input signal is sampled across the sampling capacitors 431-434, while the charge stored on capacitors 461 and 462 (due to previous phase) is reset.

During the hold phase, feedback switches 471 and 472 operate to connect feedback capacitors 461 and 462 to inputs of operational amplifier 455 and 456 respectively. Switches 421 A-C operate to connect capacitor 431 to one of Vrefp, Vrefm and Vcm terminal depending on sub code generated by flash ADC 350. The component values can be adjusted to get a voltage gain required in gain amplifier 380, as well as any subtractive/additive operations to implement DAC 360 and subtractor 370. This, as well as detailed operation of the circuit of FIG. 4, will not be described in detail, as being well known to one skilled in the relevant arts.

An aspect of the present invention reduces power consumption at least in the embodiments described above. The features of the invention will be clearer in comparison to a prior approach not implementing one or more of the features. Accordingly, the description is continued with respect to a prior approach.

5. Prior Timing Diagram

Figure 5:
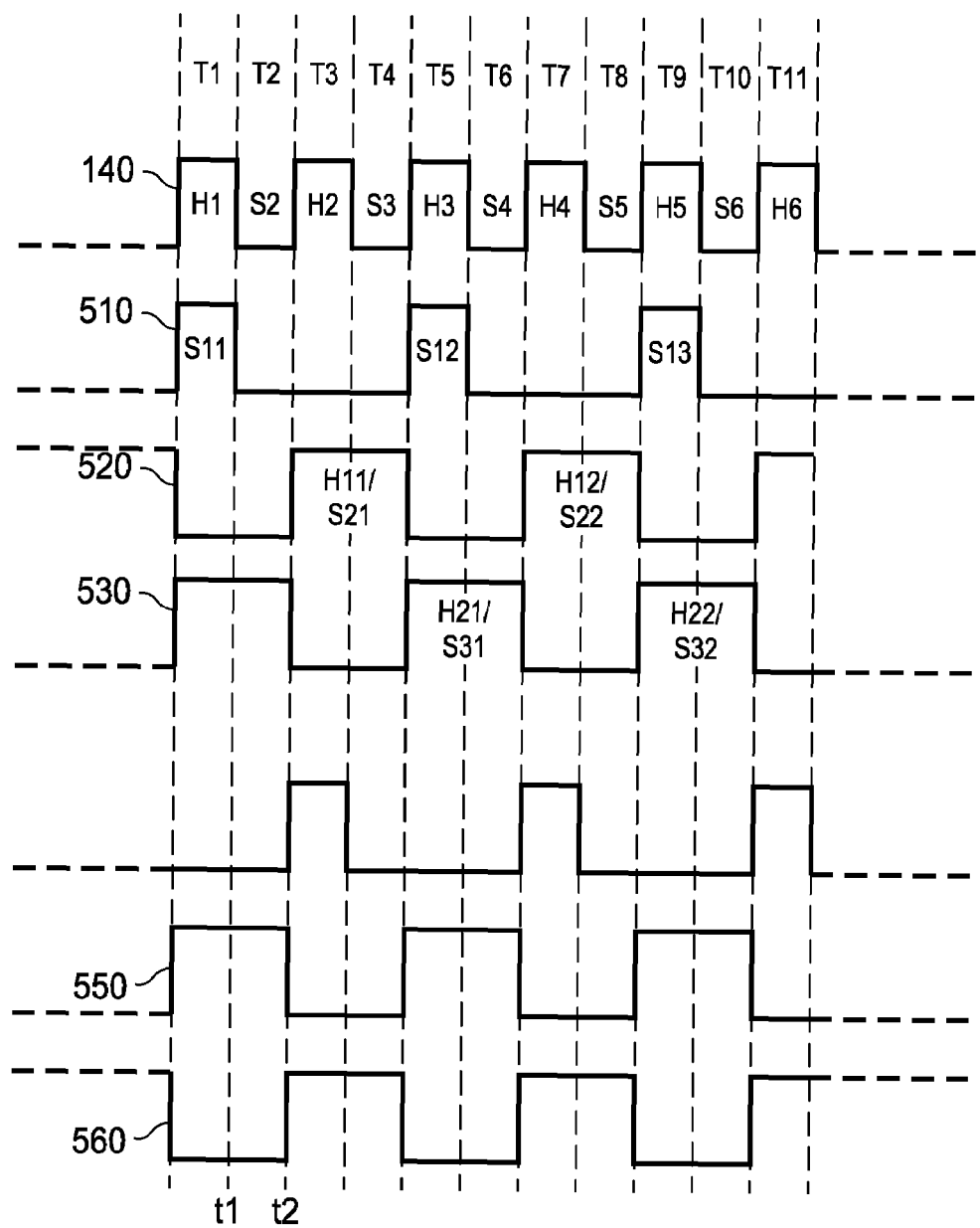
FIG. 5 is a prior timing diagram illustrating the time relationship between the operations of an input sample and hold amplifier and sample and hold phases of pipelined sub-ADCs used in a time interleaved ADC.

FIG. 5 is a prior timing diagram illustrating the time relationship between the operations of an input SHA and the sample and hold phases of (pipelined)sub-ADCs used in a time interleaved ADC. For ease of understanding the timing diagram is described/shown with respect to the embodiment of FIG. 1. For the sake of simplicity, the timing diagram is shown assuming only two pipelined sub-ADCs (for example, sub-ADC 110-1 and sub-ADC 110-2) are used in time interleaved ADC 100. Further, only a few representative cycles of the various waveforms are shown in the interest of conciseness. The description below is provided with combined reference to FIGS. 2, 3, 4 and 5. In an embodiment, each of waveforms 510, 520, 530, 540, 550 and 560 is generated by clock generator 180 and provided on path 181 to respective component.

Waveform 140 represents clock 140 provided to input SHA 120. Time intervals T2, T4, T6, T8 and T10 represent sample phases (marked S2, S3, S4, S5 and S6 in FIG. 5) in input SHA 120, i.e., time intervals during which the input analog signal 130 is sampled onto sampling capacitors (not shown, but contained internally) in input SHA 120. Time intervals T1, T3, T5, T7, T9 and T11 represent hold phases (marked H1, H2, H3, H4, H5 and H6) in input SHA 120, i.e. time intervals during which the sampled input (analog signal 130) is transferred from the internal sample capacitors (not shown) to hold capacitors (not shown) in input SHA 120. In general, a hold interval represents an interval of time during which the 'sampled' signal is transferred to the 'hold' capacitors.

Waveform 510 represents a clock provided to enable sampling in the first stage (220-1 of FIG. 2) of pipelined sub-ADC 110-1. As noted with respect to FIG. 4, sampling switches 421D, 422D, 423D and 424D, reset switches 481 and 482, and common mode switches 451 and 452 are closed during a sample phase. Logic high of waveform 510 during time intervals T1, T5 and T9 represent sample intervals (marked S11, S12, and S13 in FIG. 5), and causes the switches noted above to be closed for the corresponding interval.

Waveform 520 represents a clock provided to enable hold phases in the first stage (220-1) as well as (simultaneously) sample phases in stage 220-2 of sub-ADC 110-1. Thus, during the combined time interval T3+T4, logic high of waveform 520 enables a hold phase in stage 220-1 and a sample phase in stage 220-2 (marked H11/S21 in FIG. 5). Similarly, the combined time interval T7+T8 represents a next hold (sample) phases in stage 220-1 (220-2), and is marked H12/S22 in FIG. 5.

Waveform 530 represents a clock signal enabling hold phases in stage 220-2 and sample phases in stage 220-3 in sub-ADC 110-1.

Waveform 540 represents a clock provided to enable sampling in the first stage (not shown in the figures, but contained internally) of pipelined sub-ADC 110-2. It may be seen that the first stages of sub-ADC 110-1 and sub-ADC 110-2 sample the analog input during alternate hold phases of input SHA 120 in a time-interleaved manner.

Waveform 550 represents a clock provided to enable hold phases in the first stage as well as (simultaneously) sample phases in the second stage of sub-ADC 110-2. Waveform 560 represents a clock signal enabling hold phases in stage 2 and sample phases in stage 3 of sub-ADC 110-2.

With respect to waveform 520, it may be observed that stage 220-2 begins sampling phase S21 at start of time interval T3 and ends sampling at end of time interval T4. Thus, the output 212 of the previous stage (220-1) should reach its final value at least by end of T4. Ideally, it is desirable that output 212 reach a steady state (final) value as early as possible before end of time interval T4.

It may be also be observed that the corresponding hold phase (H11) of stage 220-1 also occurs in the same time interval T3/T4. During a hold operation of stage 220-1, operational amplifier 450 (which may have to drive both a self-capacitance and routing parasitic as well as the load presented by stage 220-2) must ensure that the output reaches its final value (settle to within an acceptable accuracy) by end of time interval T4. A similar requirement is true for subsequent stages also.

In general, it is a requirement that a hold phase of a stage operate sufficiently fast to make available a correct output for a next stage. Such a requirement may be particularly important in the first stage of a sub-ADC used in a time interleaved ADC. To meet such a requirement amplifiers used in the first stage (early stages, in general) are often implemented as high-speed amplifiers.

Thus, for example, operational amplifier 450 implemented in stage 1(220-1) of sub-ADC 110-1 may be implemented as a high-speed (high bandwidth) amplifier to provide the fast output settling time noted above. This may lead to high power dissipation in operational amplifier 450, and, in general, higher power consumption in time interleaved ADC 100.

An aspect of the present invention reduces such power dissipation as described below. Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

6. Reducing Power Consumption in Amplifier

Figure 6:
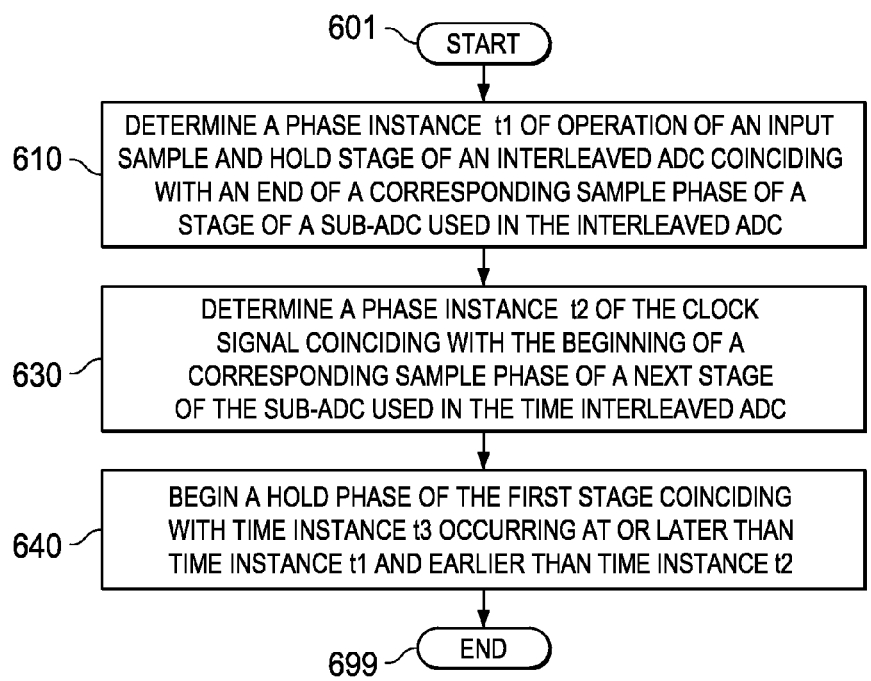
FIG. 6 is a flowchart illustrating the manner in which power consumption may be reduced in an amplifier used in an early stage of a pipelined sub-ADC used in a time-interleaved ADC according to several aspects of the present invention.

FIG. 6 is a flowchart illustrating the manner in which power consumption may be reduced in an amplifier used in an early stage of a pipelined sub-ADC used in a time-interleaved ADC according to several aspects of the present invention. The flowchart is described with respect to FIGS. 1-4 (as well as in comparison to FIG. 5), and in particular with respect to reducing power consumption in operational amplifier 450 of stage 220-1 of sub-ADC 110-1. However, it must be understood that various features can be implemented in other environments, and with other components. At least some of the techniques described below also apply to amplifiers in other stages such as 220-2 through 220-S, as well as one or more stages of sub-ADCs 110-2 through 110-N. Furthermore, the steps are described in a specific sequence merely for illustration.

Alternative embodiments in other environments, using other components, and different sequence of steps can also be implemented without departing from the scope and spirit of several aspects of the present invention, as will be apparent to one skilled in the relevant arts by reading the disclosure provided herein. The flowchart starts in step 601, in which control passes immediately to step 610.

In step 610, clock generator 180 determines a phase instance t1 of operation of an input sample and hold stage (input SHA 120) of time interleaved ADC 100 coinciding with an end of a corresponding sample phase of a stage of a sub-ADC in an time interleaved ADC. With respect to the prior timing diagram of FIG. 5, clock generator 180 determines the end of time interval T1 corresponding to end of sampling phase S11 of stage 220-1. Control then passes to step 630.

In step 630, clock generator 180 determines a phase instance t2 of operation of input SHA 120 coinciding with the beginning of a corresponding sample phase (i.e., in which the same sample received from input SHA 120 is processed) of a next stage of the sub-ADC. With respect to the prior timing diagram of FIG. 5, clock generator 180 determines the end of time interval T2 corresponding to the beginning of sampling phase S12 of stage 220-1. Control then passes to step 640.

In step 640, clock generator 180 begins a hold phase of the stage coinciding with time instance t3 occurring at or later than time instance t1 and earlier than time instance t2. Thus, with respect to FIG. 5, clock generator begins a hold phase of stage 220-1 at a time instance earlier than t2 but at or later than t1. Control then passes to step 699 in which the flowchart ends.

A timing diagram illustrating the steps described above in an example scenario is shown in FIG. 7, and is briefly described next.

7. Timing Diagram

Figure 7:
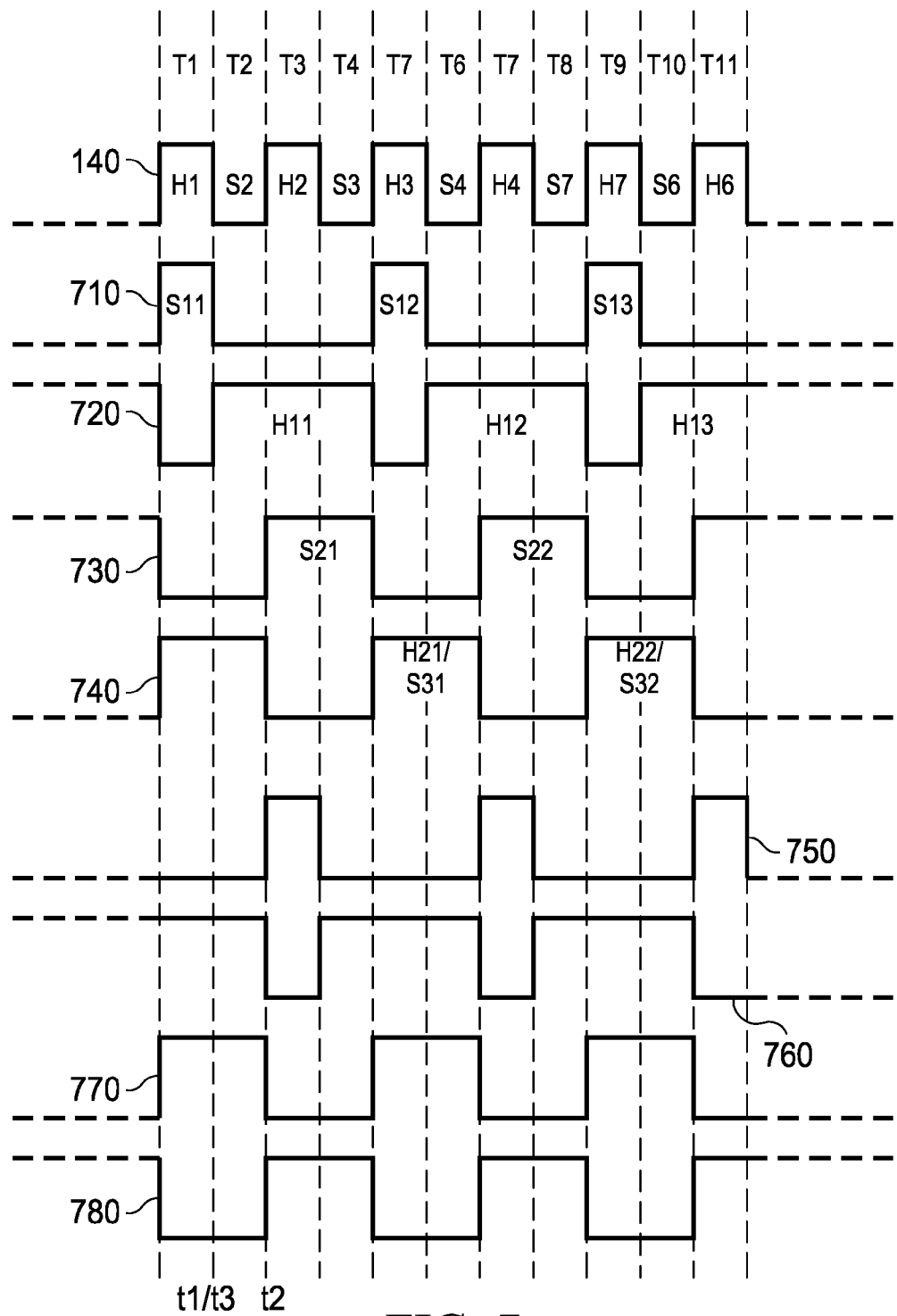
FIG. 7 is a timing diagram illustrating the time relationship between the operations of an input sample and hold amplifier and the sample and hold phases of pipelined sub-ADC in an embodiment of the present invention.

FIG. 7 is a timing diagram illustrating the time relationship between the operations of input SHA 120 and the sample and hold phases of pipelined sub-ADCs 110-1 and 110-2 in an embodiment of the present invention. Again, for ease of description, it is assumed that time-interleaved ADC 100 contains only sub-ADCs 110-1 and 110-2. It is also assumed that positive going (active) edges of the respective signals specify the start of a corresponding operation (sample or hold phase), and negative going (inactive) edges specify end of the corresponding operation.

Waveform 710 represents a sample clock used to control sample operations (sample phases) of stage 220-1 of sub-ADC 110-1. Waveform 720 represents a hold clock used to control hold operations (hold phases) of stage 220-1 of sub-ADC 110-1.

Waveform 730 represents a sample clock used to control sample operations (sample phases) of stage 220-2 of sub-ADC 110-1. Waveform 740 represents a hold clock used to control hold operations (hold phases) of stage 220-2 of sub-ADC 110-1. Waveform 740 may also be used to control sample operations in stage 220-3 of sub ADC-110-1.

Waveform 750 represents a sample clock used to control sample operations (sample phases) of the first stage (not shown) of sub-ADC 110-2. Waveform 760 represents a hold clock used to control hold operations (hold phases) of the first stage of sub-ADC 110-2.

Waveform 770 represents a sample clock used to control sample operations (sample phases) of the second stage (not shown) of sub-ADC 110-2. Waveform 780 represents a hold clock used to control hold operations (hold phases) of the second stage of sub-ADC 110-2. Waveform 780 may also be used to control sample operations of the third stage (not shown) of sub ADC-110-2. Waveforms 710, 720, 730, 740, 750, 760, 770 and 780 may be generated by clock generator 180 in a known way.

It may be observed from FIG. 7 that active edges of hold clock 720 occur earlier than active edges of sample clock 730. In FIG. 7, active edges of hold clock 720 are shown coinciding with inactive edges of sample clock 710. A similar relationship also holds with respect to waveforms 750 and 760.

Thus, more time is provided for output 212 of operation amplifier 450 of stage 220-1 of sub-ADC 110-1 to settle to its final value. It may be observed from FIG. 5 that the sample interval of stage 220-2 sampling is not concurrent (does not overlap) with the hold phase of stage 220-1 for the time interval T2 (also equal to T4, T6 etc.). Instead, hold phases (e.g., H11, H12 etc.) for stage 220-1 are started before corresponding sample phases (S21, S22 etc.) for stage 220-2.

As a result, large signal slewing to drive self-capacitance of operation amplifier 450 and routing parasitic (which in combination may be a significant fraction of the total load presented to operational amplifier 450) can happen in the interval T2 (when 220-2 is not yet sampling), and only small signal linear settling (due to load presented by stage 220-2) needs to occur once stage 220-2 starts sampling. As a result, operational amplifier 450 (as well as the first stage amplifier of sub-ADC 110-2) may be implemented as a (comparatively) lower speed (lower bandwidth) amplifiers consuming lesser power.

Similarly, more time is provided for the output of the first stage amplifier of sub-ADC 110-2 to settle to its final value. In general, amplifiers in earlier stages of pipelined sub-ADCs in time-interleaved ADC 100 may be implemented as low-speed devices to reduce overall power consumption.

Time-interleaved ADC 110 implemented according to one or more aspects of the present invention may be incorporated in a system as described next.

8. System

Figure 8:
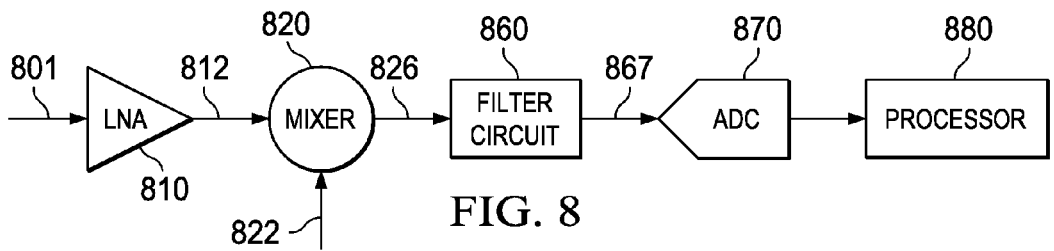
FIG. 8 is a block diagram of an example system in which various aspects of the present invention may be implemented.

FIG. 8 is a block diagram of receiver system 800 illustrating an example system in which various aspects of the present invention may be implemented. For illustration, it is assumed that receiver system 800 is implemented within a Wireless Receiver. However, receiver system 800 can be implemented in other devices (wireless as well as wire-based communications) as well.

Receiver system 800 is shown containing low noise amplifiers (LNA) 810, mixer 820, filter circuit 860, analog to digital converter (ADC) 870, and processor 880. Each block/stage is described below in further detail.

LNA 810 receives signals on path 801 and amplifies the received signals to generate a corresponding amplified signal on path 812. For example, in wireless systems, the signals that are transmitted from satellites, etc. may be received by an antenna (not shown) and the received signals are provided on path 801. The received signals may be weak in strength and thus amplified by LNA 810 for further processing. LNA 810 may be implemented in a known way.

Mixer 820 may be used to down-convert the received amplified signal on path 812 into an intermediate signal with the frequency band of interest centered at a lower frequency than the carrier frequency of the received signal. In an embodiment, a signal with the frequency band of interest centered at 2.4 GHz (carrier frequency) is converted to a signal with the frequency band of interest centered at zero frequency.

Mixer 820 may receive the amplified signal on path 812 and a signal of fixed frequency on path 822 as inputs, and provides the intermediate signal on path 826. The signal of fixed frequency on path 822 may be generated by a phase locked loop (not shown) in a known way.

Filter circuit 860 may correspond to a low pass filter, which allows the desired low frequencies and rejects all other unwanted high frequencies present in the signal received on line 826. The filtered signal, which contains the frequency band of interest, is provided on path 867.

ADC 870 converts (samples) the filtered signal received on path 867 to a corresponding digital value, which represents the signal of interest in received signal 801. Processor 880 processes the received digital values to provide various user applications and may be implemented as multiple processing units, each potentially operating independently. ADC 870 may correspond to ADC 100 (FIG. 1) described in sections above (and implemented according to various aspects of the present invention).

While the description above is provided substantially with respect to the earliest/first stage in the pipelined sub-ADC, it should be appreciated that the technique can be implemented in one or more later stages as well provided the hold phase can be started earlier than the sample of the next stage.

9. Conclusion

While various embodiments of the present invention have been described above, it should be understood that they have been presented by way of example only, and not limitation. Thus, the breadth and scope of the present invention should not be limited by any of the above-described embodiments, but should be defined only in accordance with the following claims and their equivalents.

What is claimed is:

1. A method of reducing power consumption of a stage of a pipelined sub-analog to digital converter (pipelined sub-ADC) used in a time-interleaved ADC, said pipelined sub-ADC comprising a plurality of stages, said time-interleaved ADC containing a plurality of pipelined sub-ADCs including said pipelined sub-ADC, wherein each pipelined sub-ADC in said plurality of pipelined sub-ADCs is operable to process a corresponding one of a set of samples of an analog input captured by an input sample and hold unit of said time-interleaved ADC, said method comprising:

operating said stage of said pipelined sub-ADC with a first set of clock signals, and a next stage of said pipelined sub-ADC with a second set of clock signals, wherein said next stage receives an output of said stage, wherein said first set of clock signals and said second set of clock signals are designed to cause a hold phase of said stage to commence at a first time instance earlier than a second time instance at which a sample phase of said next stage commences when processing the same sample received from said sample and hold unit.

2. The method of claim 1, wherein said first time instance occurs at the same time instance as a third time instance at which an immediately previous sample phase of said stage ends.

3. The method of claim 1, wherein said stage is the earliest stage in said pipelined sub-ADC.

4. The method of claim 1, wherein said first set of clock signals comprises a first sample clock and a first hold clock, wherein said first sample clock controls sample operations of said stage and said first hold clock controls hold operations of said stage, wherein an edge of said first hold clock specifies said first time instance.

5. The method of claim 4, wherein said first hold clock is an inverted form of said first sample clock.

6. The method of claim 1, wherein said sample and hold unit comprises a Sample and Hold Amplifier.

7. A time-interleaved analog to digital converter (ADC) comprising:
an input sample and hold unit; and
a plurality of pipelined sub-ADCs including a first pipelined sub-ADC, wherein Each pipelined sub-ADC in said plurality of pipelined sub-ADCs is operable to process a corresponding one of a set of samples of an analog input captured by said input sample and hold unit, wherein said first pipelined sub-ADC comprises:
a sample and hold unit to receive samples of said analog signal;
a plurality of stages generating a corresponding plurality of sub-codes,
wherein a first set of clock signals controls operation of a first stage contained in said plurality of stages, and a second set of clock signals controls operation of a next stage contained in said plurality of stages, wherein said next stage receives an output of said stage, and
wherein said first set of clock signals and said second set of clock signals are designed to cause a hold phase of said first stage to commence at a first time instance earlier than a second time instance at which a corresponding sample phase of said next stage commences when processing the same sample received from said input sample and hold unit.

8. The time-interleaved ADC of claim 7, further comprising a clock generator generating a master clock to control sample and hold phases of said input sample and hold unit, a first hold clock to control hold operations of said first stage, a first sample clock to control sample operations of said first stage, a second hold clock to control hold operations of said next stage, and a second sample clock to control sample operations of said next stage, wherein said first sample clock and said first hold clock are contained in said first set of clock, and said second sample clock and said second hold clock are contained in said second set of clocks.

9. The time-interleaved ADC of claim 8, wherein said clock generator is designed to determine a first phase instance of said master clock coinciding with an end of a corresponding sample phase of said first stage of said first pipelined sub-ADC,
wherein said clock generator is designed also to determine a second phase instance of said master clock coinciding with a beginning of a corresponding sample phase of said next stage of said first pipelined sub-ADC, and
wherein an active edge of said first hold clock occurs at said first phase instance, and an active edge of said second sample clock occurs at said second time instance.

10. The time-interleaved ADC of claim 9, wherein said active edge of said first hold clock occurs at a time instance at which an edge of said first sample clock specifies an end of an immediately previous sample phase of said first stage.

11. The time-interleaved ADC of claim 10, wherein said first stage is the earliest stage in said first pipelined sub-ADC.

12. A device comprising:
a processor processing a plurality of digital values; and
a time-interleaved analog to digital converter (ADC) sampling an analog signal and generating said plurality of digital values, said time-interleaved ADC comprising:
an input sample and hold unit; and
a plurality of pipelined sub-ADCs including a first pipelined sub-ADC, wherein each pipelined sub-ADC in said plurality of pipelined sub-ADCs is operable to process a corresponding one of a set of samples of said analog input captured by said input sample and hold unit, wherein said first pipelined sub-ADC comprises:
a sample and hold unit to receive samples of said analog signal;
a plurality of stages generating a corresponding plurality of sub-codes,
wherein a first set of clock signals controls operation of a first stage contained in said plurality of stages, and a second set of clock signals controls operation of a next stage contained in said plurality of stages, wherein said next stage receives an output of said stage,
and wherein said first set of clock signals and said second set of clock signals are designed to cause a hold phase of said first stage to commence at a first time instance earlier than a second time instance at which a corresponding sample phase of said next stage commences when processing the same sample received from said input sample and hold unit.

13. The device of claim 12, wherein said time-interleaved ADC further comprises a clock generator generating a master clock to control sample and hold phases of said input sample and hold unit, a first hold clock to control hold operations of said first stage, a first sample clock to control sample operations of said first stage, a second hold clock to control hold operations of said next stage, and a second sample clock to control sample operations of said next stage, wherein said first sample clock and said first hold clock are contained in said first set of clock, and said second sample clock and said second hold clock are contained in said second set of clocks.

14. The device of claim 13, wherein said clock generator is designed to determine a first phase instance of said master clock coinciding with an end of a corresponding sample phase of said first stage of said first pipelined sub-ADC,
wherein said clock generator is designed also to determine a second phase instance of said master clock coinciding with a beginning of a corresponding sample phase of said next stage of said first pipelined sub-ADC, and
wherein an active edge of said first hold clock occurs at said first phase instance, and an active edge of said second sample clock occurs at said second time instance.

15. The device of claim 14, wherein said active edge of said first hold clock occurs at a time instance at which an edge of said first sample clock specifies an end of an immediately previous sample phase of said first stage.

16. The device of claim 15, wherein said first stage is the earliest stage in said first pipelined sub-ADC.

* * * * *